United States Patent
Wang et al.

(10) Patent No.: US 9,574,951 B2
(45) Date of Patent: Feb. 21, 2017

(54) IMAGE SENSOR INCLUDING TEMPERATURE SENSOR AND ELECTRONIC SHUTTER FUNCTION

(71) Applicant: SEMICONDUCTOR COMPONENTS INDUSTRIES, LLC, Phoenix, AZ (US)

(72) Inventors: Shen Wang, Pittsford, NY (US); Gregory Oscar Moberg, Rochester, NY (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 574 days.

(21) Appl. No.: 14/021,667

(22) Filed: Sep. 9, 2013

(65) Prior Publication Data

US 2015/0070488 A1 Mar. 12, 2015

(51) Int. Cl.
| | |
|---|---|
| *G01K 11/00* | (2006.01) |
| *G01J 5/00* | (2006.01) |
| *G01K 13/00* | (2006.01) |
| *G01K 7/01* | (2006.01) |
| *H01L 27/146* | (2006.01) |

(52) U.S. Cl.
CPC ........... *G01K 13/00* (2013.01); *G01K 7/01* (2013.01); *H01L 27/14601* (2013.01)

(58) Field of Classification Search
USPC .......................................... 374/161, 131, 121
See application file for complete search history.

(56) References Cited

U.S. PATENT DOCUMENTS

| | | |
|---|---|---|
| 4,067,028 A | 1/1978 | Lermann et al. |
| 4,170,932 A | 10/1979 | Lalancette |
| 4,199,023 A | 4/1980 | Phillips |
| 4,418,339 A | 11/1983 | Spofford et al. |
| 4,576,487 A | 3/1986 | Conover et al. |
| 4,587,563 A | 5/1986 | Bendell et al. |
| 4,662,736 A | 5/1987 | Taniguchi et al. |
| 4,739,409 A | 4/1988 | Baumeister |

(Continued)

FOREIGN PATENT DOCUMENTS

| | | |
|---|---|---|
| DE | 2719706 A1 | 11/1978 |
| EP | 0809299 A2 | 11/1997 |

(Continued)

OTHER PUBLICATIONS

English language abstract not available for DE 2719706; however, see machine-assisted translation extracted from the espacenet.com database on Aug. 29, 2013, 22 pages.

(Continued)

*Primary Examiner* — Mirellys Jagan

(57) ABSTRACT

An image capture device includes an image sensor. The image sensor includes a temperature sensor for measuring temperature measurements of the image sensor. A timing generator is coupled to the image sensor for applying an electronic shutter pulse to the image sensor to drain away all charge in photodiodes of the image sensing region prior to image capture. A reading component is coupled to the temperature sensor for reading the temperature measurements from the temperature sensor. The image capture device is configured to prevent erroneous temperature readings by the reading component resulting from substrate punch-through from the application of the electronic shutter pulse.

6 Claims, 12 Drawing Sheets

(56) References Cited

U.S. PATENT DOCUMENTS

| | | | |
|---|---|---|---|
| 5,032,897 A | 7/1991 | Mansuria et al. | |
| 5,519,518 A | 5/1996 | Watanabe et al. | |
| 5,539,672 A | 7/1996 | Mullin et al. | |
| 5,557,550 A | 9/1996 | Vigil et al. | |
| 5,572,051 A | 11/1996 | Arakawa et al. | |
| 5,596,228 A | 1/1997 | Anderton et al. | |
| 6,278,487 B1 | 8/2001 | Nakashiba | |
| 6,329,233 B1 | 12/2001 | Pan et al. | |
| 6,342,780 B1 | 1/2002 | Pickering | |
| 6,607,301 B1* | 8/2003 | Glukhovsky | A61B 1/041 374/117 |
| 6,617,174 B2 | 9/2003 | Rotstein | |
| 6,934,050 B2 | 8/2005 | Merrill et al. | |
| 7,001,067 B2 | 2/2006 | Huston et al. | |
| 7,064,313 B1 | 6/2006 | Mann et al. | |
| 7,110,028 B1 | 9/2006 | Merrill | |
| 7,191,599 B2 | 3/2007 | Hara | |
| 7,214,575 B2 | 5/2007 | Rhodes | |
| 7,446,508 B2 | 11/2008 | Aradachi et al. | |
| 7,508,225 B2 | 3/2009 | Taylor | |
| 7,702,935 B2 | 4/2010 | Cornwell et al. | |
| 7,737,665 B2 | 6/2010 | Grewe et al. | |
| 7,770,402 B2 | 8/2010 | Quarre | |
| 7,787,033 B2 | 8/2010 | Rossi et al. | |
| 7,990,441 B2 | 8/2011 | Lee | |
| 8,138,530 B2 | 3/2012 | Park et al. | |
| 2003/0127666 A1 | 7/2003 | Lee | |
| 2004/0170215 A1* | 9/2004 | Rossi | H04N 5/361 374/183 |
| 2005/0230681 A1 | 10/2005 | Folkerts et al. | |
| 2008/0188029 A1 | 8/2008 | Rhodes | |
| 2008/0210872 A1* | 9/2008 | Grimberg | G01J 5/522 250/339.04 |
| 2008/0217666 A1 | 9/2008 | Kao | |
| 2009/0001428 A1 | 1/2009 | Rhodes | |
| 2009/0078973 A1 | 3/2009 | Hzu et al. | |
| 2011/0169993 A1 | 7/2011 | Rhodes | |
| 2011/0221931 A1* | 9/2011 | Wakabayashi | G01K 7/01 348/229.1 |
| 2012/0087384 A1 | 4/2012 | Zayer et al. | |
| 2012/0104229 A1* | 5/2012 | Kwon | G01J 5/22 250/208.1 |
| 2012/0161972 A1 | 6/2012 | Huang | |
| 2012/0164783 A1 | 6/2012 | Park et al. | |
| 2012/0248289 A1 | 10/2012 | Tanaka | |
| 2013/0037533 A1* | 2/2013 | Namekawa | H04N 5/232 219/494 |
| 2013/0049777 A1 | 2/2013 | Wang et al. | |
| 2013/0051427 A1 | 2/2013 | Wang et al. | |
| 2013/0083206 A1* | 4/2013 | Makino | H04N 5/37213 348/207.1 |
| 2013/0139524 A1 | 6/2013 | Kim et al. | |
| 2013/0170520 A1* | 7/2013 | Englasyam | G01K 7/015 374/178 |
| 2013/0187161 A1 | 7/2013 | Yamazaki | |
| 2013/0259086 A1* | 10/2013 | Lane | G01J 5/046 374/121 |
| 2015/0070540 A1* | 3/2015 | Wang | H01L 31/02002 348/294 |
| 2015/0103387 A1* | 4/2015 | Wu | B29D 11/00605 359/230 |
| 2015/0187239 A1* | 7/2015 | Dunn | B81B 3/007 359/230 |

FOREIGN PATENT DOCUMENTS

| | | |
|---|---|---|
| GB | 1426231 A | 2/1976 |
| JP | 07-336603 A | 12/1995 |
| WO | WO 0221609 A1 | 3/2002 |

OTHER PUBLICATIONS

English language abstract and machine-assisted translation for JP 07-336603 extracted from the PAJ database on Jul. 26, 2013, 35 pages.

Bart Dierickx et al., "Near-100 % fill factor standard CMOS active pixel", retrieved on Aug. 4, 2013 from http://citeseerx.ist.psu.edu, 4 pages.

* cited by examiner

FIG. 4
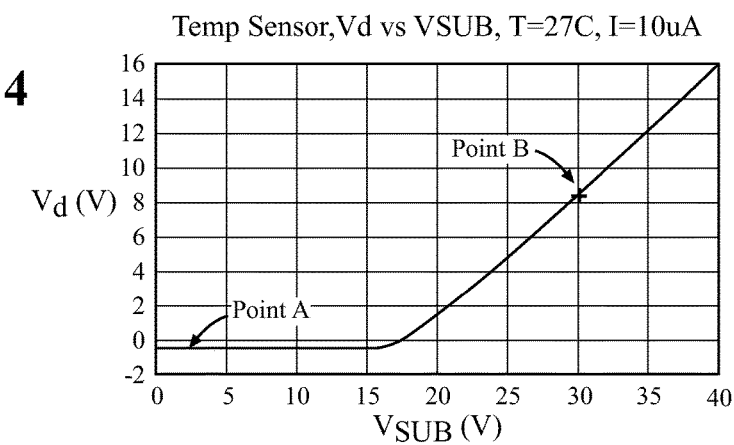
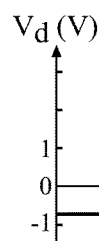 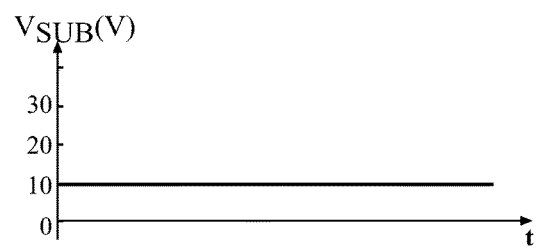
FIG. 5A FIG. 5B
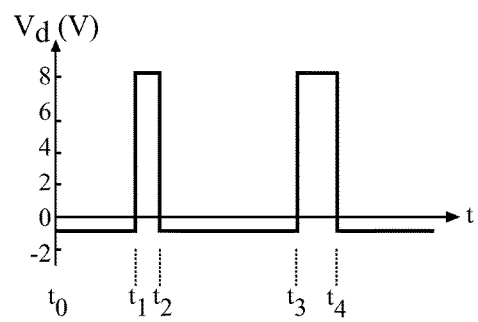 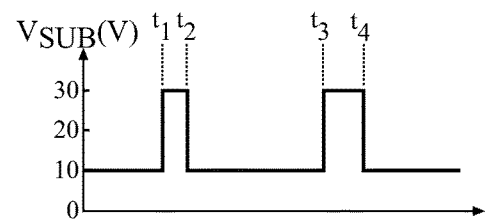
FIG. 6A FIG. 6B

IMAGE SENSOR INCLUDING TEMPERATURE SENSOR AND ELECTRONIC SHUTTER FUNCTION

BACKGROUND OF THE INVENTION

1. Field of the Invention

The present invention includes an image sensor including a temperature sensor and operable to use the temperature sensor compatibly with an electronic shutter pulse. The present invention also includes a method of compatibly using the temperature sensor and the electronic shutter pulse.

2. Description of the Related Art

Performance of an integrated circuit, such as an image sensor, can be dependent on the temperature of the integrated circuit. As one example, dark current inside an image sensor is highly temperature dependent. The dark current increases with an increase of temperature of the integrated circuit and higher dark current degrades the performance of the image sensor. Higher dark current impacts the dynamic range and the dark reference level of the image sensor and can cause various defects in captured images. The image sensor is also susceptible to permanent damage if the temperature becomes too high.

The image sensor can include a temperature sensor, such as a temperature diode, for measuring the temperature of the image sensor. The measurements from the temperature diode can be read by a reading component, such as an analog-to-digital converter, and a processor connected to the reading component can control a thermoelectric cooler coupled to the image sensor based on the temperature measurements.

When voltage is applied across the temperature diode to forward bias the diode, current flows through the diode. The relationship between the voltage across the diode and the current through the diode is temperature dependent. In other words, at the same voltage, the current increases with the temperature. Likewise, at the same current, the absolute value of the voltage decreases with the temperature. When the relationship between voltage across the diode and the current through the diode is calibrated for the image sensor, the temperature of the image sensor can be determined by reading one of these parameters while setting the other parameter at a constant.

One advantage in some types of image sensors, e.g., an interline transfer image sensor, is the ability to apply a global reset to an image sensing region of the image sensor by applying a high voltage pulse to the substrate of the image sensor to drain away all charge in photodiodes of the image sensing region prior to image capture. The high voltage pulse is referred to as an electronic shutter pulse. However, when voltage associated with the electronic shutter pulse is sufficiently high, e.g., above 17V, substrate punch-through occurs, which increases the voltage across the temperature diode. Since the temperature measurement from the temperature diode is dependant on the relationship between the voltage across the diode and the current through the diode, the voltage increase across the temperature diode due to the substrate punch-through from the electronic shutter pulse disadvantageously alters the temperature measurement from the temperature diode.

In other words, the electronic shutter pulse causes substrate punch-through at the diode and corrupts readings from the temperature diode, thus making the temperature diode and the electronic shutter pulse incompatible features. The voltage increase across the temperature diode from the electronic shutter pulse can also cause damage to the reading component. There remains an opportunity to design a circuit that can determine the temperature of the image sensor without corruption from the application of the electronic shutter pulse.

SUMMARY OF THE INVENTION AND ADVANTAGES

One embodiment of the invention includes an image capture device comprising an image sensor including a temperature sensor for measuring temperature measurements of the image sensor. A timing generator is coupled to the image sensor for applying an electronic shutter pulse to the image sensor. A reading component is coupled to the temperature sensor and reads the temperature measurements from the temperature sensor only in the absence of the electronic shutter pulse. A processor is coupled to the reading component and the timing generator and is configured to instruct the timing generator to apply the electronic shutter pulse to the image sensor and to disable the reading of the temperature measurements by the reading component during the application of the electronic shutter pulse.

Another embodiment of the invention includes a method of determining a temperature of an image sensor. The method comprises measuring the temperature of the image sensor with a temperature sensor; reading temperature measurements from the temperature sensor; applying an electronic shutter pulse to the image sensor; and disabling the reading of the temperature measurements during the electronic shutter pulse to avoid reading a temperature measurement that is altered by the electronic shutter pulse.

Another embodiment of the invention includes an image capture device comprising an image sensor including a temperature sensor for measuring temperature measurements of the image sensor. A reading component is coupled to the temperature sensor for reading the temperature measurements from the image sensor. A timing generator is coupled to the image sensor for applying an electronic shutter pulse to the image sensor. A voltage regulator is between the temperature sensor and the reading component for regulating increased voltage at the reading component resulting from the electronic shutter pulse.

Another embodiment of the invention includes a method of determining a temperature of an image sensor. The method comprises measuring the temperature of the image sensor with a temperature sensor; reading temperature measurements from the temperature sensor with a reading component; applying an electronic shutter pulse to the image sensor; and regulating voltage between the temperature sensor and the reading component resulting from the electronic shutter pulse to prevent damage to the reading component.

By disabling the reading of temperature measurements by the reading component during application of the electronic shutter pulse, the processor ensures that erroneous readings corrupted by substrate punch-through from the electronic shutter pulse are not read and acted upon by the image capture device. In other words, this advantageously ensures that the image capture device does not erroneously operate based on the erroneous temperature measurements resulting from substrate punch-through from the electronic shutter pulse.

The voltage regulator advantageously regulates increased voltage resulting from electronic shutter pulse. Specifically, the voltage regulator regulates voltage at the reading component at a level sufficiently low to prevent damage to the reading component. The voltage regulator also prevents reading of an erroneous temperature measurement resulting from the substrate punch-through from the electronic shutter pulse.

BRIEF DESCRIPTION OF THE DRAWINGS

Other advantages of the present invention will be readily appreciated, as the same becomes better understood by reference to the following detailed description when considered in connection with the accompanying drawings wherein:

FIG. 4 is a graph showing the effect on voltage through the diode associated with substrate punch-through resulting from the application of an electronic shutter pulse to the image sensor;

FIGS. 5A and 5B are graphs comparing voltage across the temperature diode, shown in FIG. 5A, in the absence of an electronic shutter pulse, as shown in FIG. 5B;

FIGS. 6A and 6B are graphs comparing voltage across the temperature diode, shown in FIG. 6A, during the application of an electronic shutter pulse to the image sensor, as shown in FIG. 6B;

FIG. 9A is a schematic cross-sectional view of the image sensor of FIG. 2 when $V_{SUB}$ is set to 0V and in the absence of substrate punch-through;

DETAILED DESCRIPTION OF THE INVENTION

Figure 1:
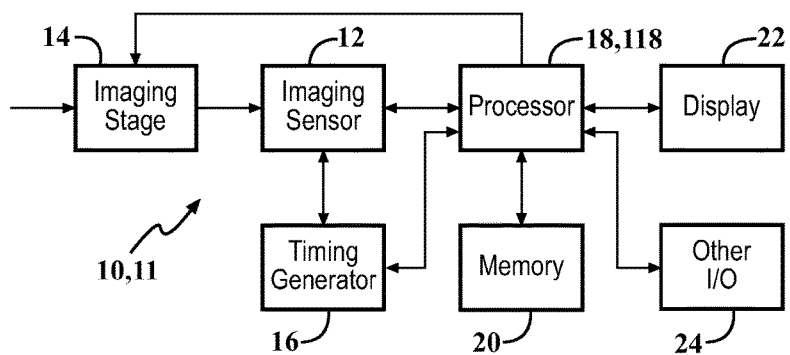
FIG. 1 is a block diagram of an image capturing device including an image sensor.

With reference to the Figures, wherein like numerals indicate like parts throughout the several views, a simplified block diagram of an image capture device 10 including an integrated circuit, e.g., an image sensor 12, is shown in FIG. 1. The image capture device 10 is implemented as a digital camera 11 in FIG. 1. Those skilled in the art will recognize that a digital camera 11 is only one example of the image capture device 10. Alternatively, the image capture device 10 can be, for example, a cell phone camera, scanner, copier, digital video camcorder, etc.

In the digital camera 11, light from a subject scene is input to an imaging stage 14. The imaging stage 14 can include conventional elements (not shown) such as a lens, a neutral density filter, an iris and a shutter. Light is focused by the imaging stage 14 to form an image on the image sensor 12. The image sensor 12 captures one or more images by converting the incident light into electrical signals. By way of example only, the image sensor 12 can be a charge-coupled device (CCD) image sensor or a complementary metal-oxide semiconductor (CMOS) image sensor.

With continued reference to FIG. 1, a timing generator 16 is coupled to the image sensor 12 and transmits various control and timing signals to image sensor 12. The control and timing signals include the timing signals in the timing patterns needed to read out charge from image sensor 12. The timing generator 16 shown in FIG. 1 can represent one or more timing generators 16 that produce various control and timing signals for image sensor 12. The one or more timing generators 16 can be integrated with image sensor 12 or implemented separately from image sensor 12.

The digital camera 11 includes a processor 18 and memory 20, and typically includes a display 22, and one or more additional input/output (I/O) elements 24. Although shown as separate elements in the embodiment of FIG. 1, the imaging stage 14 may be integrated with image sensor 12, and possibly one or more additional elements of the digital camera 11, to form a compact camera module.

The processor 18 may be implemented, for example, as a microprocessor, a central processing unit (CPU), an application-specific integrated circuit (ASIC), a digital signal processor (DSP), or other processing device, or combinations of multiple such devices. Various elements of the imaging stage 14 and the image sensor 12 may be controlled by timing signals or other signals supplied from the processor 18 and/or the timing generator 16. The processor 18 is coupled to the timing generator 16 and, based on the operating mode of the digital camera 11, the processor 18 is configured to control the timing generator 16. The processor 18 instructs the timing generator 16 to produce various vertical CCD or horizontal CCD clocking signals depending on the operating mode of the digital camera 11.

The memory 20 may be configured as any type of memory, such as, for example, random access memory (RAM), read-only memory (ROM), Flash memory, disk-based memory, removable memory, or other types of storage elements, in any combination. A given image captured by the image sensor 12 may be stored by the processor 18 in the memory 20 and presented on the display 22. The display 22 is typically an active matrix color liquid crystal display (LCD), although other types of displays may be used. The additional I/O elements 24 may include, for example, various on-screen controls, buttons or other user interfaces, network interfaces, or memory card interfaces. A voltage driver (not shown) may also be included, particularly when a large voltage clock is also included and drives the image sensor 12. Other components, such as a power supply (not shown) may also be included.

It is to be appreciated that the digital camera 11 shown in FIG. 1 may comprise additional or alternative elements of a type known to those skilled in the art. Elements not specifically shown or described herein may be selected from those known in the art. Also, certain aspects of the embodiments described herein may be implemented at least in part in the form of software executed by one or more processing elements of the digital camera 11. Such software can be implemented in a straightforward manner given the teachings provided herein, as will be appreciated by those skilled in the art.

Figure 2:
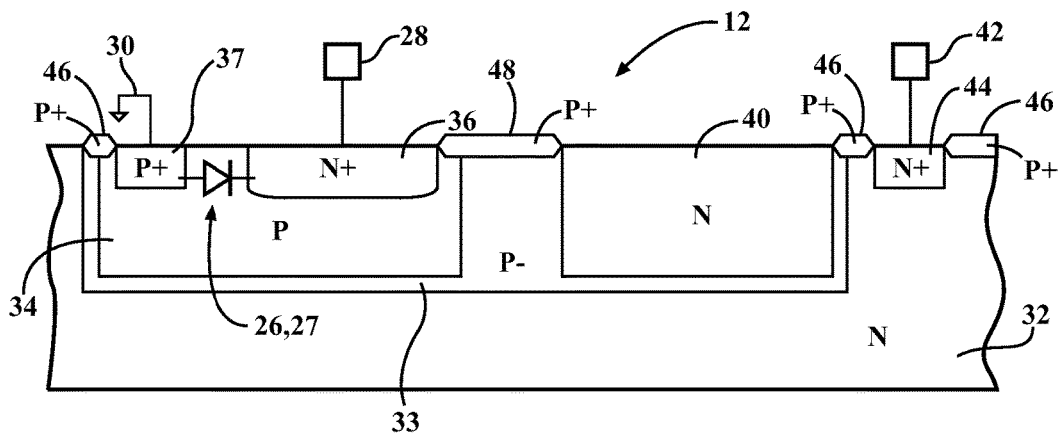
FIG. 2 is a schematic cross-sectional view of one embodiment of the image sensor including a temperature diode.

FIG. 2 shows a cross-section of one embodiment of the image sensor 12 including a temperature sensor 26 for measuring temperature measurements of the image sensor 12. Specifically, the temperature sensor 26 is a temperature diode 27 implemented as a PN junction diode. The temperature diode 27 is connected to a bond pad 28 and to a reference voltage, which is ground 30 in FIG. 2.

With continued reference to FIG. 2, the image sensor 12 includes an n-type substrate 32. Within the substrate 32 is a lightly doped p-type layer 33. A heavily doped p-type well 34 and an n-type region 40 are disposed in the lightly doped p-type layer 33. A p-plus implant region 37 and an n-plus implant region 36 are disposed in the heavily doped p-type well 34. The p-plus implant region 37 is connected to ground 30. N-type region 40 is an image sensing region (also referred to herein as image sensing region 40), which forms and includes active pixels (not shown) and transfer registers (not shown).

The temperature diode 27 is disposed in the p-type layer 33. The temperature diode 27 is disposed between the n-plus implant region 36 and the p-plus implant region 37. The anode of the temperature diode 27 is connected to the p-plus implant region 37. The cathode of the temperature diode 27 is connected to the n-plus implant region 36. The cathode of the temperature diode 27 is connected to the bond pad 28 through the n-plus implant region 36. The anode of the temperature diode 27 is connected to ground 30 through the p-plus implant region 37. The n-type substrate 32 is connected to bond pad 42 through the n-plus implant region 44. As set forth further below, a reading component 38, e.g., an analog-to-digital converter (ADC) is connected to the bond pad 28 and, as such, the reading component 38 is connected to the cathode of the temperature diode 27. The image sensor 12 may also include output amplifiers (not shown) that output signal. The temperature diode 27 may be separated from the n-type region 40 by a p-type channel stop region 48 that acts to prevent interference between the temperature diode 27 and other components within the n-type region 40. Other channel stop regions 46 may be included in other areas of the image sensor 12. Channel stop regions 46 may be p-type regions.

Figure 3:
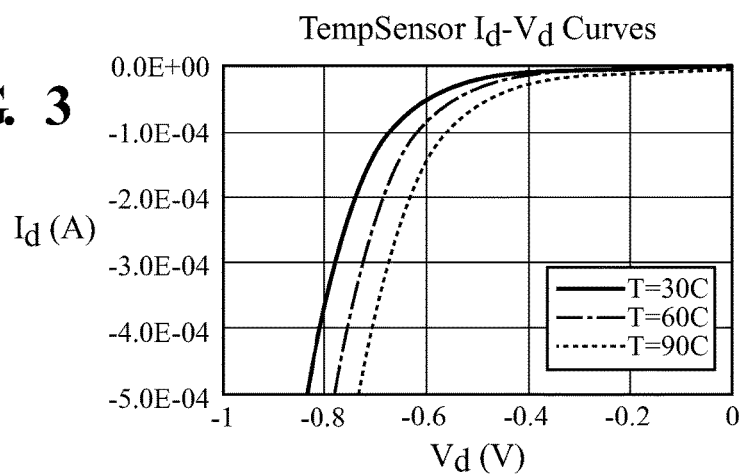
FIG. 3 is a graph showing the correlation between voltage across the temperature diode and current through the temperature diode at three different temperatures of the image sensor.
Figure 7:
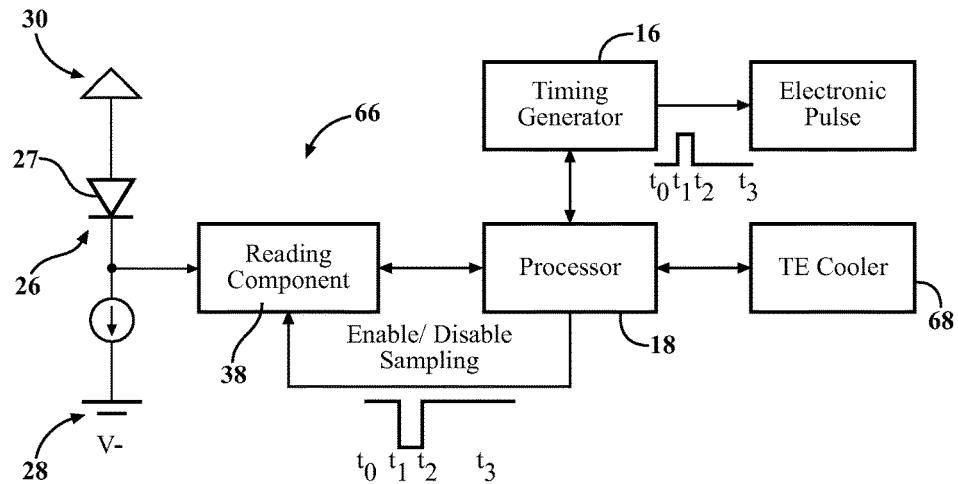
FIG. 7 is a block diagram of a first embodiment of a circuit of the image capturing device.
Figure 8:
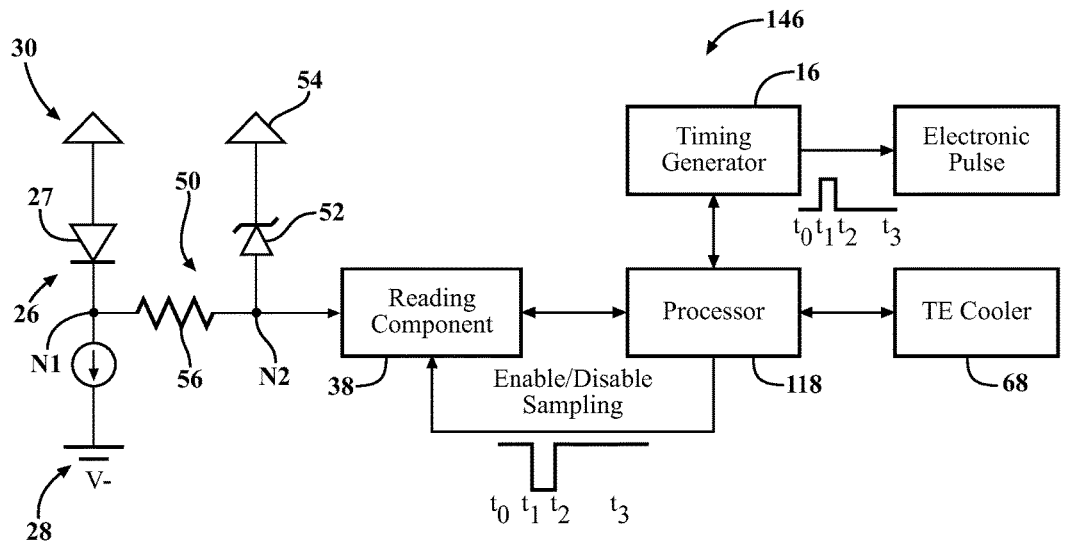
FIG. 8 is a block diagram of a second embodiment of a circuit of the image capturing device.

When a negative voltage is applied at the bond pad 28, the temperature diode 27 is forward-biased and current flows through the temperature diode 27 from ground 30 to the bond pad 28. The relationship between voltage $V_d$ across the temperature diode 27 and current $I_d$ through the temperature diode 27 is temperature dependent. In other words, at the same voltage, the current increases with the temperature. Likewise, at the same current, the absolute value of the voltage decreases with the temperature. For example, FIG. 3 shows the voltage $V_d$ and the current $I_d$ of the temperature diode 27 for three different temperatures, namely 30° C., 60° C., and 90° C. When the relationship between $V_d$ and $I_d$ is calibrated for the image sensor 12, the temperature of the image sensor 12 is determined by reading one parameter while setting the other parameter at a constant. As set forth further below, temperature measurements from the temperature diode 27 are read with the reading component 38, e.g., an analog-to-digital converter (ADC) as shown in FIGS. 7 and 8.

One method that can be used to calculate temperature is to compare different voltages at a constant current. The voltage values at different temperatures are obtained along a vertical line in FIG. 3 when the current of the power supply is constant, e.g., at −0.002 A. The voltage values corresponding to temperatures can be included in a look-up table saved in the memory 20 of the image capture device 10. The temperature of the image sensor 12 can be obtained by matching the diode voltage $V_d$ with one of the diode voltages stored in the lookup table. If a voltage falls in between two voltage values, a linear interpolation can be performed to get the temperature value.

Another method that can be used to calculate temperature is to compare different current values obtained at a constant voltage. The current values at different temperatures are obtained along the vertical line when the voltage is constant, e.g., at −0.7V. The current values corresponding to temperatures can be included in a look-up table saved in the memory 20 of the image capture device 10. The temperature of the image sensor 12 can be obtained by matching the diode current $I_d$ with one of the diode currents stored in the lookup table. If a current falls in between two current values in the look-up table, a linear interpolation can be performed to get the temperature value.

The image capture device 10 includes an electronic shutter feature. Prior to capturing an image, a global reset is applied to the image sensing region by pulsing the substrate to a high voltage to drain away all charge in photodiodes (not shown) of the image sensing region 40. The pulse is referred to in industry as an electronic shutter pulse. Typically, the electronic shutter pulse is between 20V and 40V. The timing generator 16 applies the electronic shutter pulse to the image sensor 12. Specifically, the processor 18 is connected to and controls the timing generator 16 and instructs the timing generator 16 to apply the electronic shutter pulse to the image sensor 12. The image sensor 12 can be, for example, an interline transfer image sensor 12 that uses an electronic shutter pulse.

The electronic shutter pulse is applied to the substrate 32 through a bond pad 42 connected to an n-plus implant region 44. Specifically with reference to FIGS. 4-6B, a voltage $V_{SUB}$ is applied at the bond pad 42. The electronic shutter pulse is applied by raising voltage $V_{SUB}$ to between 20V and 40V. With reference to FIG. 4, when $V_{SUB}$ is set low, i.e., during a non-pulse state, the temperature diode 27 functions normal. For example, FIG. 4 shows one example when $V_{SUB}$ is below 17V, the voltage $V_d$ of the temperature diode 27 remains at about −0.7V (see point A). However, when the $V_{SUB}$ increases above 17V, the voltage $V_d$ of the diode starts to be pulled up by the $V_{SUB}$ voltage due to the substrate punch-through. At point B, i.e., when $V_{SUB}$ is 30V, the voltage $V_d$ of the temperature diode 27 reaches approximately 8V, which disrupts the normal V-I characteristics of the temperature diode 27 shown in FIG. 3. In other words, the V-I relationship of the temperature diode 27 is only valid when $V_{SUB}$ is below 17V.

FIGS. 5A and 5B show $V_d$ and $V_{SUB}$ versus time when $V_{SUB}$ is maintained at 10V and FIGS. 6A and 6B show $V_d$ and $V_{SUB}$ versus time when $V_{SUB}$ is pulsed to 30V to apply the electronic shutter pulse to the substrate 32. With reference to FIGS. 5A and 5B, when $V_{SUB}$ is set at a constant 10V, the voltage $V_d$ of the temperature diode 27 is at its normal range, i.e., about −0.7V. However, as shown in FIGS. 6A and 6B, when $V_{SUB}$ is pulsed to 30V between times t1 and t2 and between times t3 and t4, the voltage $V_d$ of the temperature diode 27 is pulled up to 8V. Since the voltage $V_d$ of the temperature diode 27 is corrupted due to the substrate punch-through, readings from the temperature diode 27 between t1 and t2 and between t3 and t4 are not valid to correlate to the temperature of the image sensor 12. For example, when a temperature control-loop circuit inside the digital camera 11 monitors temperature, an erroneous temperature reading will occur during the activation of the electronic shutter pulse inside the image sensor 12.

A first embodiment of a circuit 66 of the image capture device 10 is shown in FIG. 7. With reference to FIG. 7, the reading component 38 is coupled to the temperature sensor 26. As set forth above, the reading component 38 reads temperature measurements from the temperature sensor 26.

In the embodiment shown in FIG. 7, the reading component 38 reads the temperature measurements from the temperature sensor 26 only in the absence of the electronic shutter pulse. Specifically, the processor 18 is configured to instruct the timing generator 16 to apply the electronic shutter pulse to the image sensor 12 and to disable the reading of the temperature measurements by the reading component 38 during the application of the electronic shutter pulse. The processor 18 simultaneously disables the reading of the temperature measurement by the reading component 38 and instructs the timing generator 16 to supply the electronic shutter pulse. The processor 18 subsequently enables the reading of the temperature measurement by the reading component 38 after the electronic shutter pulse is completed.

As shown in FIG. 7, the circuit 66 includes a cooler 68 for cooling the image sensor 12 based on the temperature measurements by the temperature sensor 26. The cooler 68, for example, is a thermoelectric (TE) cooler.

The following is a description of a method of determining the temperature of the image sensor 12 using the circuit 66 shown in FIG. 7. The method includes measuring the temperature of the image sensor 12 with the temperature sensor 26, specifically with the temperature diode 27. Specifically, the step of measuring the temperature includes applying a constant current to the bond pad 28 to forward bias the temperature diode 27. In the embodiment shown in FIG. 7, the constant current applied to the bond pad 28 is a negative current, typically −10 uA. Alternatively, a constant voltage may also be applied to the bond pad 28 to forward bias the temperature diode 27. In the embodiment shown in FIG. 7, the constant voltage applied to the bond pad 28 is a negative voltage, typically −0.7V.

The method includes reading temperature measurements from the temperature sensor 26, and specifically, reading the temperature measurements with the reading component 38, e.g., the ADC. The step of reading includes reading the diode voltage $V_d$ with the reading component 38. This step includes comparing the diode voltage $V_d$ with known voltage-temperature values, i.e., in the lookup table as set forth above. Alternatively, the step of reading includes reading the diode current $I_d$ with the reading component 38. This step includes comparing the diode current $I_d$ with known current-temperature values, i.e., in the lookup table as set forth above.

The method includes applying the electronic shutter pulse to the image sensor 12. Specifically, applying the electronic shutter pulse includes applying increased voltage to the bond pad, e.g., typically between 20V and 40V. As set forth above, the processor 18 instructs the timing generator 16 to apply the electronic shutter pulse to the bond pad 42.

The method includes disabling the reading of the temperature measurements during the electronic shutter pulse to avoid reading a temperature measurement that is altered by the electronic shutter pulse. The application of the electronic shutter pulse and the disablement of the reading of the temperature measurements are simultaneous. By disabling the reading of the temperature measurement during the electronic shutter pulse, the processor 18 avoids the erroneous V-I characteristic through the temperature diode 27 associated with the substrate punch-through from the electronic shutter pulse. Accordingly, errors associated with such erroneous readings are avoided.

After the electronic shutter pulse has been applied, the method includes resuming the reading of the temperature measurements after the electronic shutter pulse is applied. Specifically, after the electronic shutter pulse is completed, the processor 18 instructs the reading component 38 to resume reading temperature measurements from the temperature sensor 26.

The method includes instructing the cooler 68 to cool the image sensor 12 based on the temperature measurement. The method includes reading a last temperature measurement before the electronic shutter pulse is applied and instructing the cooler 68 based on the last temperature measurement during the application of the electronic shutter pulse. The method includes resuming the reading of the temperature measurements after the electronic shutter pulse is applied and providing instructions to the cooler 68 from the processor 18 based on the new temperature measurements after the reading of the temperature measurements is resumed. In other words, when the electronic shutter pulse is applied, the cooler will use the last temperature measurement until the processor 18 instructs the reading component 38 to take the next reading after the electronic shutter pulse is completed.

A second embodiment of a circuit 146 of the image capture device 10 is shown in FIG. 8. Common numerals are used to identify common elements in FIGS. 7 and 8. The circuit 146 of FIG. 8 includes a voltage regulator 50 between the temperature sensor 26 and the reading component 38 for regulating voltage across the temperature sensor 26 from the electronic shutter pulse. A processor 118 is connected to the reading component 38 and the timing generator 16. It should be appreciated that the voltage regulator 50 can also be used with the circuit 66 of FIG. 7, i.e., with the processor 18 configured to instruct the timing generator 16 to apply the electronic shutter pulse to the image sensor 12 and to disable the reading of the temperature measurements by the reading component 38 during the application of the electronic shutter pulse, as set forth above.

The voltage regulator 50 includes a Zener diode 52. The Zener diode 52 is connected to ground 54 and is configured to short-circuit to ground 54 when voltage associated with the electronic shutter pulse is applied to the temperature sensor 26, i.e., when the substrate punch-through occurs and the voltage across the temperature diode 27 increases. In other words, the operating parameters of the Zener diode 52 are designed such that the Zener diode 52 is off when the voltage across the temperature diode 27 is normal, i.e., in the absence substrate punch-through associated with the electronic shutter pulse as shown in FIG. 5A, and is designed to turn on when substrate punch-through occurs and the voltage across the temperature diode 27 exceeds a predetermined level. The higher voltage from the substrate punch-through turns on the Zener diode 52 such that the Zener diode 52 is forward biased and current flows from the temperature diode 27 through the Zener diode 52 to ground 54. The Zener diode 52 can be of any type, such as semiconductor, ceramic, etc., that is suitable to turn on in response to higher voltage across the temperature diode 27 from substrate punch-through.

This short-circuit to ground 54 protects the reading component 38 from the high voltage across the temperature diode 27 that results from the substrate punch-through. When the Zener diode 52 is turned on, the Zener diode 52 regulates the voltage at the reading component 38 to a constant voltage, e.g., 0.7V. When the electronic shutter pulse is completed, the V-I characteristic through the temperature diode 27 returns to normal and the Zener diode 52 turns off such that the Zener diode 52 again reads the temperature measurements temperature diode 27.

The voltage regulator 50 includes a resistor 56 between the Zener diode 52 and the temperature sensor 26. The resistor 56 isolates the Zener diode 52 from the temperature sensor 26. In other words, the Zener diode 52 and the resistor 56 together form a resistively isolated voltage clamp. During substrate punch-through, this isolation caused by the resistor 56 enables the Zener diode 52 to regulate the voltage at the reading component 38. In other words, the resistor 56 allows the voltage at node N1 to be different than the voltage at node N2 and allows the Zener diode 52 to provide a constant voltage at node N1 when the Zener diode 52 is on. The parameters of the resistor 56 are chosen based on design requirements as known to one skilled in the art. The resistance of the resistor 56 is chosen to be high enough so as to not appreciably load the temperature diode 27, and an input bias current from the reading component 38 does not create a significant offset voltage on the resistor 56.

The following is a description of a method of determining the temperature of an image sensor 12 using the circuit shown in FIG. 8. The method of FIG. 8 includes measuring the temperature of the image sensor 12 with a temperature sensor 26 and reading temperature measurements from the temperature sensor 26 with a reading component 38, as set forth above with reference to FIG. 7. The method also includes applying an electronic shutter pulse to the image sensor 12 as set forth above with reference to FIG. 7.

The method includes regulating voltage between the temperature sensor 26 and the reading component 38 from the electronic shutter pulse to prevent damage to the reading component 38. Specifically, regulating the voltage includes short-circuiting current through the temperature sensor 26 associated with the electronic shutter pulse through the Zener diode 52 to ground 54.

The method includes increasing voltage at the Zener diode 52 to turn the Zener diode 52 on during substrate punch-through, i.e., turning the Zener diode 52 on in response to increased voltage across the temperature diode 27 from substrate punch-through to regulate the voltage level at the reading component 38. The method also includes reducing the voltage at the Zener diode 52 to turn the Zener diode 52 off after completion of the electronic shutter pulse, i.e., turning the Zener diode 52 off when the voltage across the temperature diode 27 returns to normal in response to completion of the electronic shutter pulse. When the Zener diode 52 is turned off, the method includes resuming measurement of the temperature measurements from the temperature diode 27 with the reading component 38. Accordingly, the method protects the reading component 38 from high voltage across the temperature diode 27 associated from the substrate punch-through from the electronic shutter pulse.

Figure 9A:
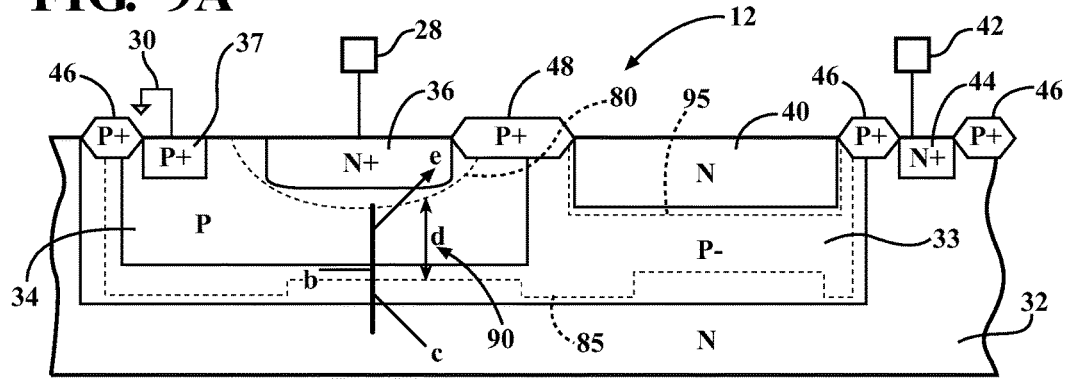
Figure 9B:
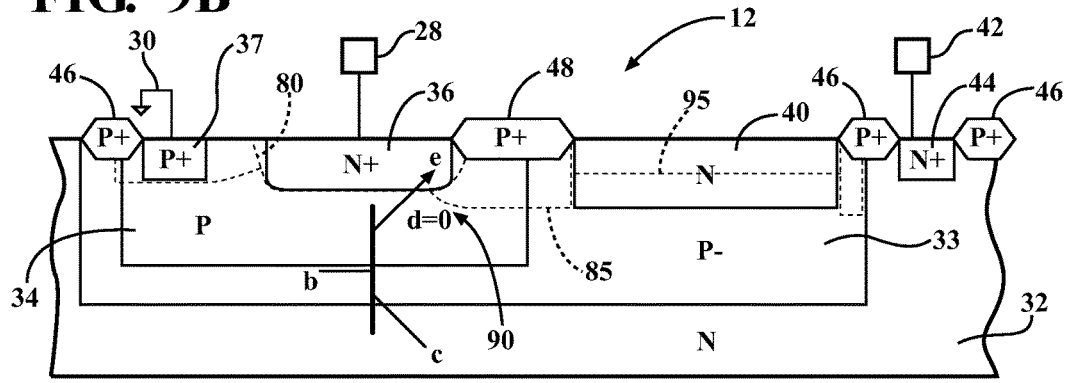
FIG. 9B is a schematic cross-sectional view of the image sensor of FIG. 2 illustrating a type of substrate punch-through when $V_{SUB}$ is set to 30V.
Figure 10A:
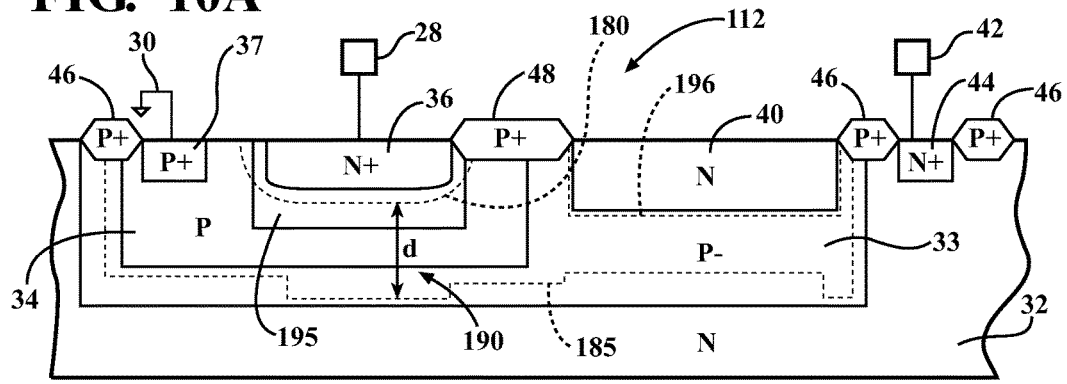
FIGS. 10A and 10B are schematic cross-sectional views of embodiments of an image sensor including a temperature sensor when $V_{SUB}$ is set to 0V and 30V.
Figure 10B:
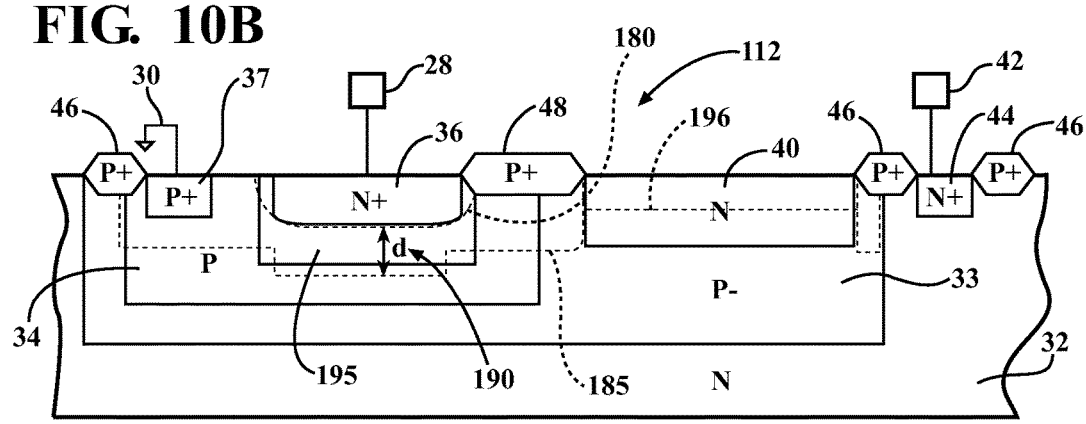

Other embodiments of an image sensor 112 is shown in FIGS. 10A and 10B. By way of example, FIG. 9A schematically shows a cross-section of the image sensor of FIG. 2 when substrate punch-through is not observed and FIG. 9B schematically shows a cross-section of the image sensor of FIG. 2 experiencing substrate punch-through, an effect that is reduced or eliminated by the exemplary embodiments of the image sensor, including a temperature sensor, of FIGS. 10A and 10B.

Specifically, FIGS. 9A and 9B show a cross-section of image sensor 12 and illustrate a type of substrate punch-through with respect to the image sensor of FIG. 2. FIG. 9A shows the image sensor 12 when $V_{SUB}$ is set to 0V and FIG. 9B shows the image sensor 12 when $V_{SUB}$ is set to 30V. The p-type well 34 and the lightly doped p-type layer 33 are disposed between the n-type substrate 32 and the n-plus implant region 36. A bipolar transistor forms with an emitter at the region 36, a collector at substrate 32 and a base in between substrate 32 and region 36. It follows that a PN junction forms between the emitter and the base and another PN junction forms between the base and the collector. As shown in FIG. 9A, depletion boundary line 80 references the depletion boundary between the emitter and the base and depletion boundary line 85 references the depletion boundary between the base and the collector. Depletion boundary line 95 references the depletion boundary of n-type region 40. Effective base channel length d, marked by arrow 90, is the distance between the top of depletion boundary (between the emitter and the base) as referenced by line 80 and the bottom of depletion boundary (between the base and the collector) as referenced by line 85. When $V_{SUB}$ is set to 0V, as shown in FIG. 9A, lines 80 and 85 are not shorted together, i.e., d is greater than 0, and the bipolar transistor functions in a normal state and substrate punch-through is not observed. The temperature diode (not shown) measures temperature adequately and correctly, as shown in FIG. 4 at Point A.

For a PN junction, the depletion depth may be affected by either the voltage across the junction or the doping profile across the junction, as described in S. M. Sze; "Physics of Semiconductor Devices"; $2^{nd}$ Ed, 1981; pp. 74-79. In substrate punch-through, the depletion depth increases if the voltage across either of the PN junctions (between the emitter and the base or between the base and the collector) increases. Since the electronic shutter pulse voltage, i.e., $V_{SUB}$ at a high level, is applied at the collector end of the bipolar transistor, the depletion boundary line 85 is pushed upwards. It follows that the effective base channel length d narrows. FIG. 9B shows when $V_{SUB}$ reaches a certain value, e.g. 30V, the two depletion boundaries lines 80 and 85 meet and short together. No base will effectively exist causing the emitter and the collector to short together during substrate punch-through. In this type of substrate punch-through, the base channel length d equals zero (d=0). The majority carrier, i.e., electrons, in the collector region is swept away from the collector to the emitter, causing the substrate punch-through. When d equals 0, the bipolar transistor acts like an ohmic resistor which pulls up the voltage from about −0.7V to a more positive value, exhibiting substrate punch-through, for example, as shown in FIG. 4 at Point B. It is understood that the location of depletion boundary line 95 may vary from the location of line 95 as shown due to the amount and thickness of layers in the n-type region 40.

As set forth above, higher doping will decrease the depletion depth of the base. If the doping density in the base (p type) increases, the depletion boundary line 80 pushes up and the depletion boundary line 85 pushes down. In this case, the effective base channel length d widens. If the doping density in the base is high enough, even when $V_{SUB}$ is set at maximum value of 40V, the effective base channel length d is still wide enough to prevent substrate punch-through. In embodiments as shown in FIGS. 10A and 10B, an additional p-type implant region 195 is added to the heavily doped p-type well 34 to aid in reducing or preventing substrate punch-through. As such, the temperature diode voltage is minimally disrupted, or not disrupted at all, by the electronic shutter pulse voltage.

As set forth above, FIG. 10A shows a cross-section of the image sensor 112 when $V_{SUB}$ is set to 0V and FIG. 10B shows a cross-section of the image sensor 112 when $V_{SUB}$ is set to 30V. The image sensor 112 includes a substrate having a first conductivity type. The substrate may be a wafer with an n-type substrate 32. Alternatively, the wafer may be of a p-type substrate. The wafer may be a silicon wafer.

The image sensor 112 also includes a first well in the substrate. The first well has an opposite conductivity type and is doped with opposite conductivity type dopant at a first dosage at a first implantation energy. The first well may be a lightly doped p-type layer 33. Alternatively, if the wafer is of the p-type substrate, the first well may be a lightly doped n-type layer.

The image sensor 112 also includes a second well in the first well. The second well has the opposite conductivity type and is doped with opposite conductivity type dopant at a second dosage higher than the first dosage. The second well may be a heavily doped p-type well 34. Alternatively, if the wafer is of the p-type substrate, the second well may be a heavily doped n-type well.

The image sensor 112 may include a third well in the first well and adjacent the second well. The third well has the first conductivity type and is doped with first conductivity type dopant at the first dosage at the first implantation energy. The third well may be an n-type region 40. Alternatively, if the wafer is of the p-type substrate, the third well may be a p-type region.

Figure 11:
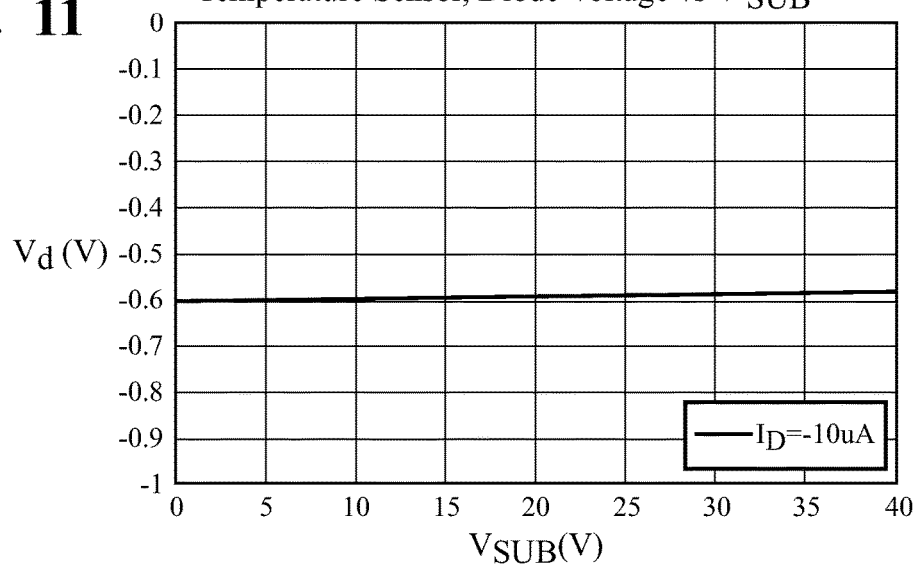
FIG. 11 is a graph of the voltage across the temperature sensor during the application of an electronic shutter pulse in the image sensor of FIG. 10.

The image sensor 112 also includes a first region in the second well. The first region has the opposite conductivity type and is doped with opposite conductivity type dopant at a second implantation energy higher than the first implantation energy. With continued reference to FIGS. 10A and 10B, as compared to FIG. 2, the first region may be an additional p-type implant region 195 disposed within the heavily doped p-type well 34 and under the n-plus implant region 36 (described below). In this case, the additional p-type implant region 195 increases the p type dose concentration between the n-plus implant region 36 and the n-type substrate 32. This pushes the depletion boundary, referenced by line 180, upwards and also pushes the depletion boundary, referenced by line 185, downwards. Depletion boundary line 196 references the depletion boundary surrounding n-type region 40. Therefore, the effective base channel length d is increased. The increase in the effective base channel length d acts to reduce or eliminate the substrate punch-through described with respect to FIGS. 9A and 9B. FIG. 10B shows that even when $V_{SUB}$ is 30V, the effective base length d is still greater than 0 (zero) and substrate punch-through is not observed. FIG. 11 is a graph of the voltage across the temperature diode during the application of the electronic shutter pulse voltage in the image sensor 112 of FIGS. 10A and 10B. The diode voltage is shown on the y-axis and the electronic shutter pulse voltage $V_{SUB}$ is shown on the x-axis. As shown, at −10 uA (constant current), the diode voltage is constant when $V_{SUB}$ changes from 0V to 40V. There is no voltage pull-up attributable to substrate punch through as shown in FIG. 4. The small up-trend of the diode voltage as a function of $V_{SUB}$ is due to a small leakage current flowing from the substrate to temperature diode. The up-trend change is so small that it will not impact the temperature sensor performance. Therefore, the additional p-type implant region 195 aids in reducing or altogether eliminating substrate punch-through when an electronic shutter pulse is applied to the image sensor 112. Alternatively, if the wafer is of the p-type substrate, the first region may be an additional n-plus region disposed within a heavily doped n-type well. It is understood that the location of depletion boundary line 196 may vary from the location of line 196 as shown due to the amount and thickness of layers in the n-type region 40.

The image sensor 112 also includes a second region in the first region. The second region has the first conductivity type and is doped with first conductivity type dopant at a third dosage higher than the second dosage at the first implantation energy. The second region may be an n-plus implant region 36. Alternatively, if the wafer is of the p-type substrate, the second region may be a p-plus implant region.

The image sensor 112 also includes a third region in the second well adjacent the first region. The third region has the opposite conductivity type and is doped with opposite conductivity type dopant at the third dosage at the first implantation energy. The third region may be a p-plus implant region 37. Alternatively, if the wafer is of the p-type substrate, the third region may be an n-plus implant region.

The image sensor 112 may include a fourth region in the substrate and adjacent the first well. The fourth region has the first conductivity type and is doped with first conductivity type dopant at the third dosage at the first implantation energy. The fourth region may be an n-plus implant region 44. Alternatively, if the wafer is of the p-type substrate, the fourth region may be a p-plus implant region.

The image sensor 112 also includes a temperature sensor for measuring temperature measurements of the image sensor. The temperature sensor is disposed between the second region and the third region and is connected to each of the second region and the third region. The temperature sensor may be a temperature diode implemented as a PN junction diode. The temperature diode is connected to a bond pad 28 through the n-plus implant region 36 and is connected to a reference voltage, which is ground 30, through the p-plus implant region 37.

Figure 12A:
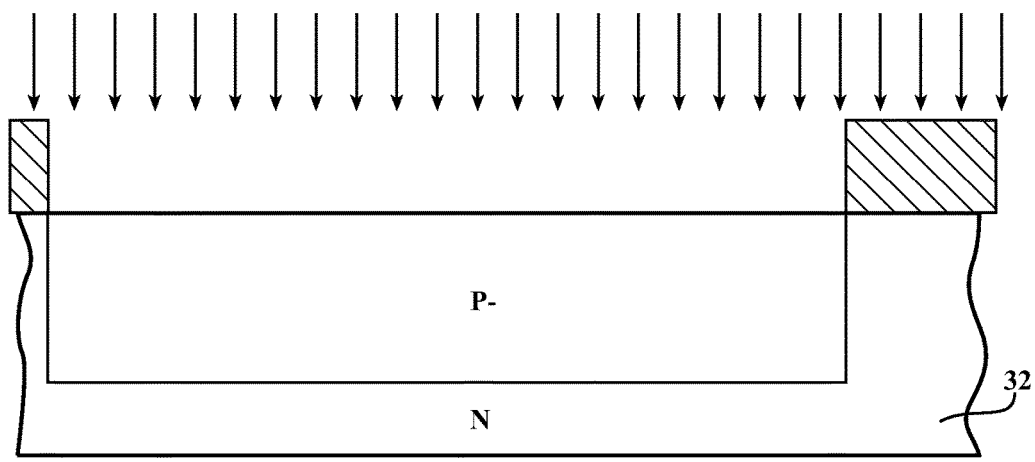
FIGS. 12A to 12N are schematic cross-sectional views showing manufacturing steps of the image sensor of FIGS. 10A and 10B.
Figure 12B:
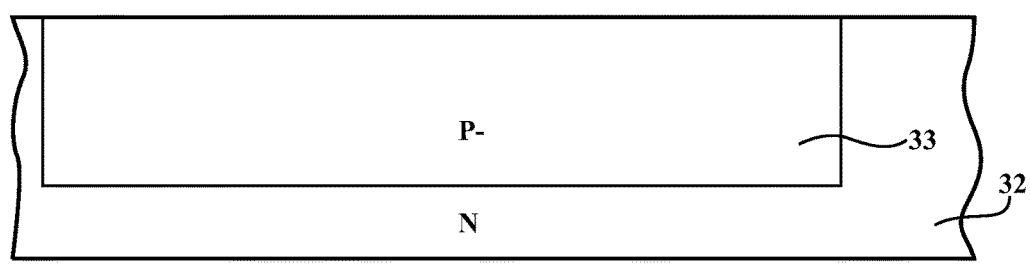
Figure 12C:
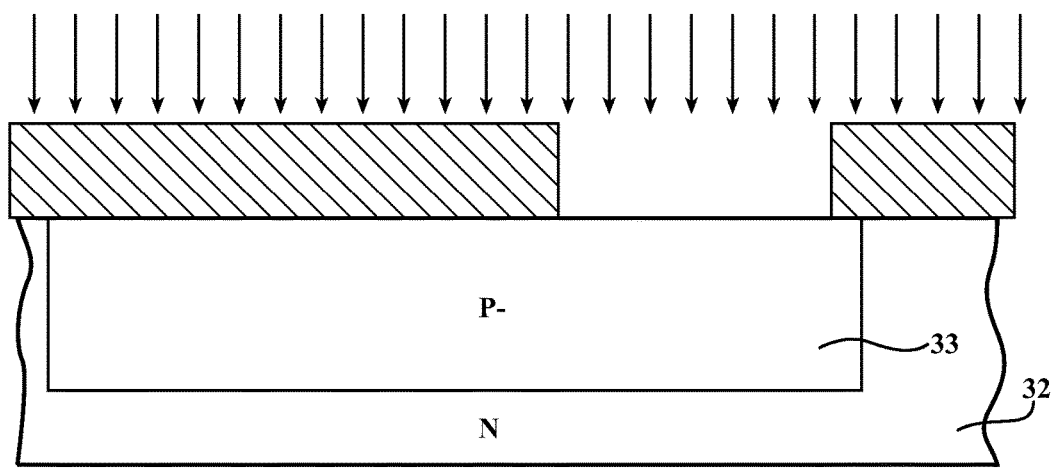
Figure 12D:
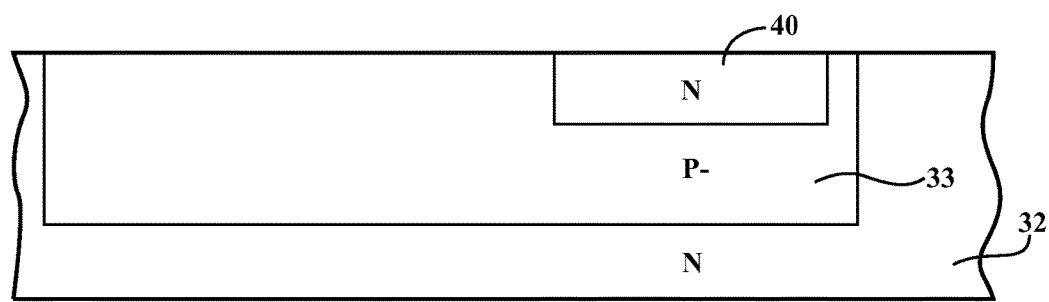
Figure 12E:
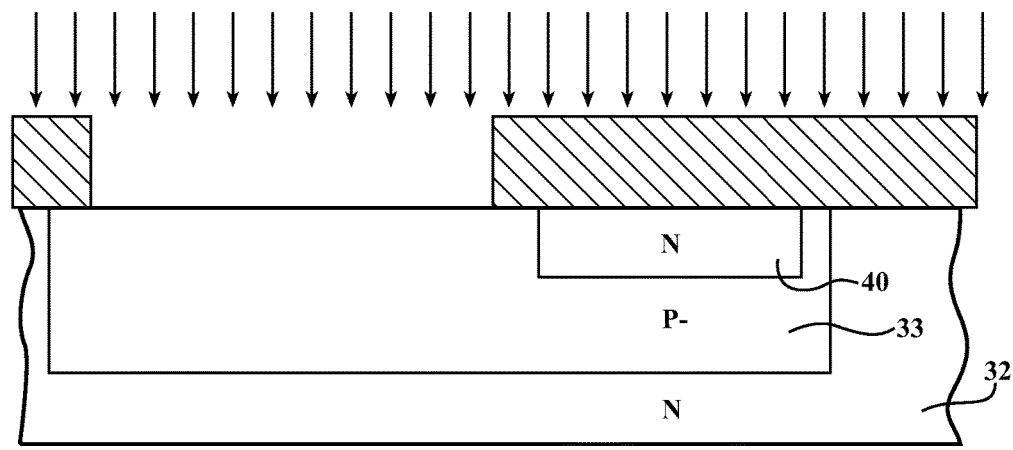
Figure 12F:
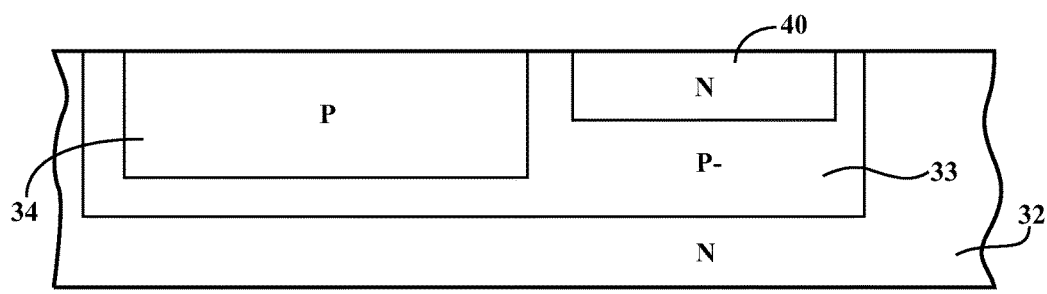
Figure 12G:
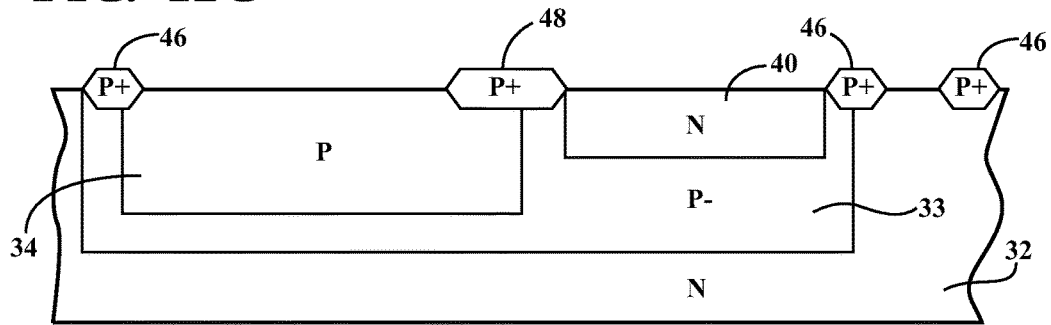
Figure 12H:
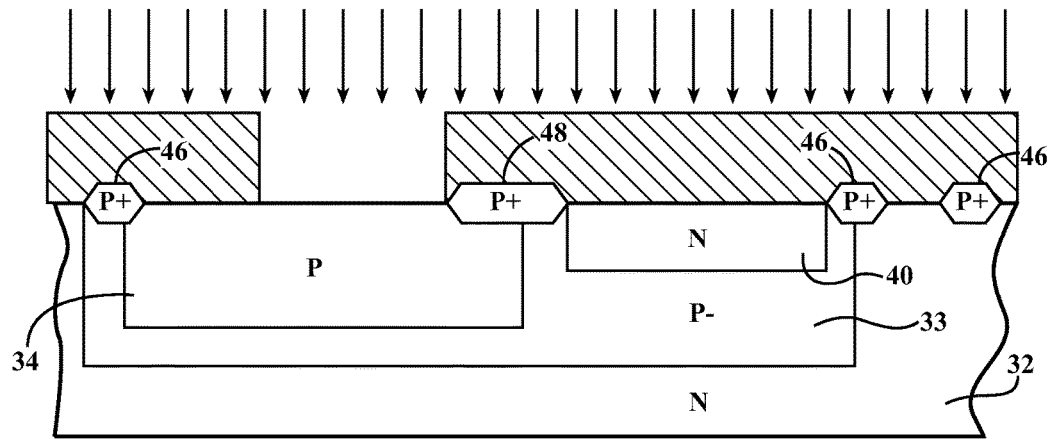
Figure 12I:
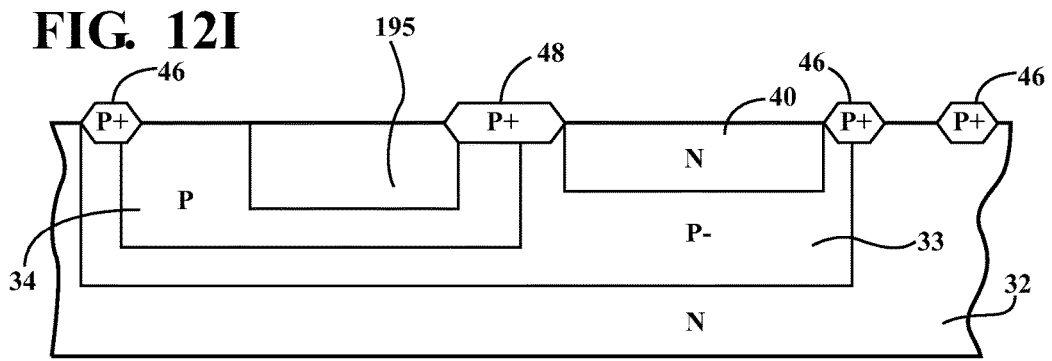
Figure 12J:
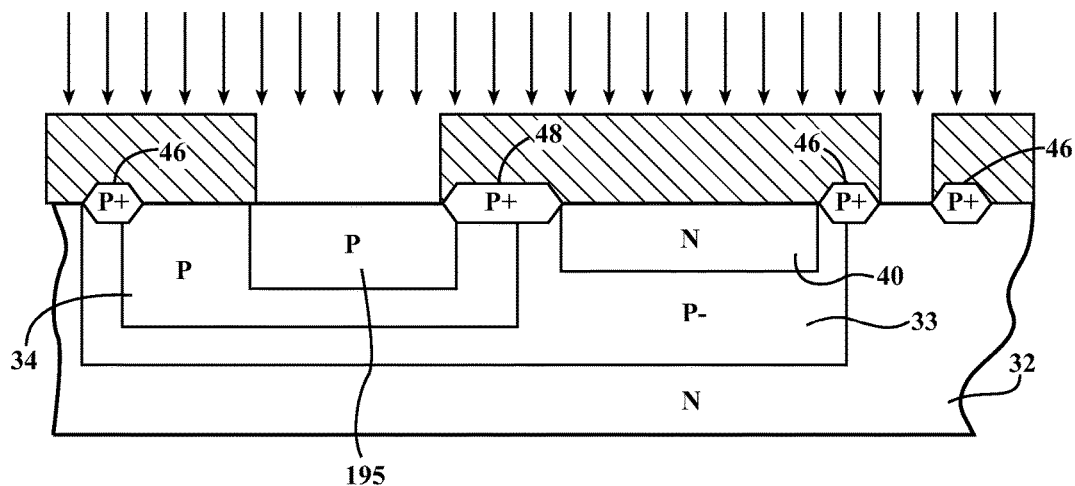
Figure 12K:
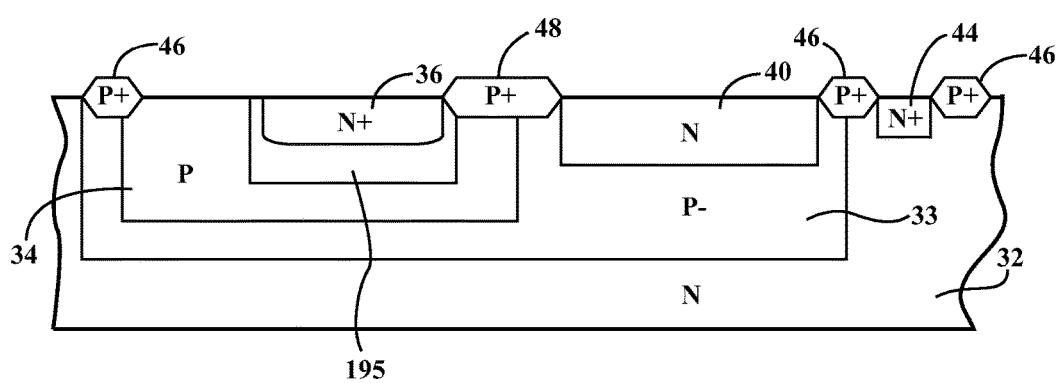
Figure 12L:
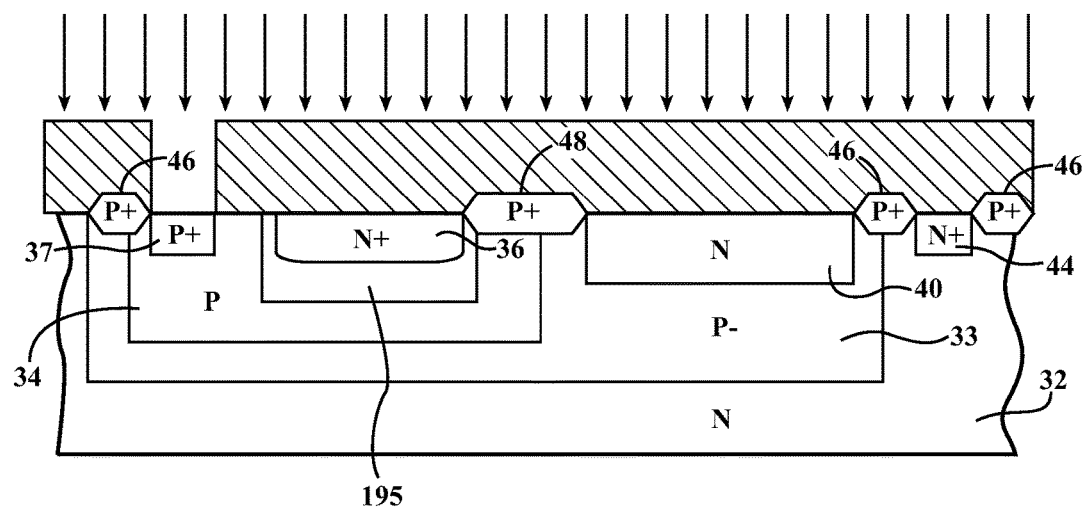
Figure 12M:
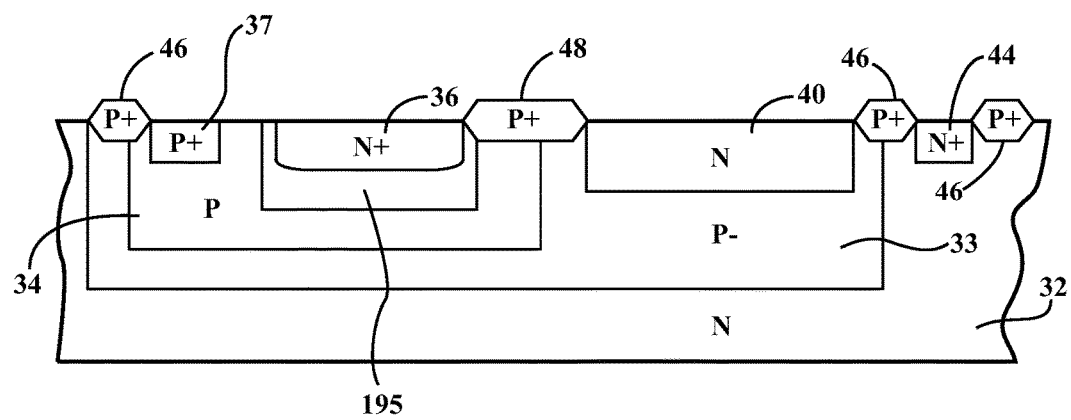
Figure 12N:
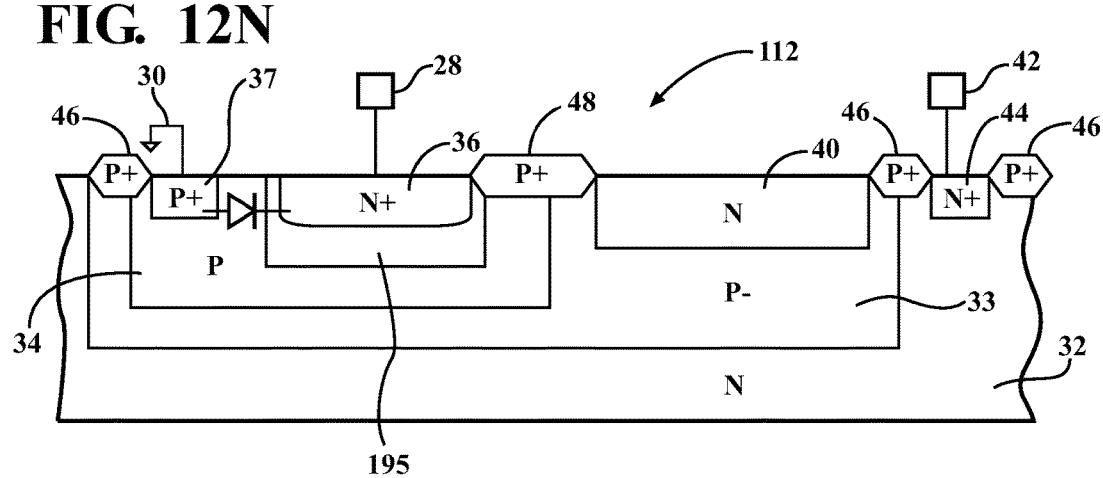

FIGS. 12A to 12N show an embodiment of a process of manufacturing the image sensor 112 of FIGS. 10A and 10B. The image sensor has the substrate having the first conductivity type. The substrate may be the wafer with an n-type substrate 32. Alternatively, the wafer may be of the p-type substrate. The wafer may be the silicon wafer. The wafer with the n-type substrate 32 is loaded for further processing. A masking process step defines at least one opening in a resist layer. In FIG. 12A, a blanket ion implantation process is performed on the wafer. In this process, an opposite conductivity type dopant is doped at the first dosage at the first implantation energy to form the first well having an opposite conductivity type in the substrate. For example, a p-type dopant is lightly doped into the n-type substrate 32 by the blanket ion implantation process. If the wafer is of a p-type substrate, an n-type dopant is lightly doped into the p-type substrate. The p-type dopant may be boron. The blanket ion implantation process typically proceeds at a dosage on the order of 1E11 ions/cm$^2$ and implantation energy on the order of 100 keV. As shown in FIG. 12B, the resist layer is stripped by typical methods and a thermal well drive is conducted to form the first well, for example, the lightly doped p-type layer 33. Alternatively, if the wafer is of a p-type substrate, a lightly doped n-type layer is formed. The thermal drive typically proceeds for about 10 hours at about 1100° C. in a furnace.

As shown in FIG. 12C, another masking step defines at least one opening in another resist layer. Another blanket implantation process is performed on the wafer. In this process, a first conductivity type dopant is doped at the first dosage at the first implantation energy to form the third well having the first conductivity type in the first well and adjacent to a second well (described below). For example, an n-type dopant is doped into the lightly doped p-type layer 33 by this blanket implantation process. If the wafer is of a p-type substrate, a p-type dopant is lightly doped into the lightly doped n-type layer. The n-type dopant may be phosphorus. The blanket ion implantation process typically proceeds at a dosage on the order of 1E11 ions/cm² and implantation energy on the order of 100 keV. As shown in FIG. 12D, the resist layer is stripped by typical methods and a thermal well drive is conducted to form the third well, for example, the n-type region 40. Alternatively, if the wafer is of a p-type substrate, a p-type region is formed. The thermal drive typically proceeds for about 10 hours at about 1100° C. in a furnace.

As shown in FIG. 12E, another masking step defines at least one opening in another resist layer. Another blanket implantation process is performed on the wafer. In this process, an opposite conductivity type dopant is doped at the second dosage higher than the first dosage to form the second well having the opposite conductivity type in the first well. Additionally, this process may proceed at the first implantation energy. For example, a p-type dopant is heavily doped into the lightly doped p-type layer 33 by this blanket implantation process. If the wafer is of a p-type substrate, an n-type dopant is heavily doped into the lightly doped n-type layer. The p-type dopant may be boron. The blanket ion implantation process typically proceeds at a dosage on the order of 1E12 ions/cm² and implantation energy on the order of 100 keV. As shown in FIG. 12F, the resist layer is stripped by typical methods and a thermal well drive is conducted to form the second well, for example, the heavily doped p-type well 34. Alternatively, if the wafer is of a p-type substrate, a heavily doped n-type well is formed. The thermal drive typically proceeds for about 5 hours at about 1100° C. in a furnace.

After the well implant and drive is completed, an insulation layer (not shown) is grown on top of the substrate, i.e., wafer. The insulation layer may be a nitride layer or an oxide/nitride combination layer. Then a masking step (not shown) is performed on the insulation layer to define a channel stop region 48 and other channel stop regions 46 followed by implanting a p-plus impurity into the wafer. The p-plus impurity may be boron. Thus, the channel stop region 48 may be a p-type region. A field oxide is then grown in the channel stop region 48. An etching step is then performed to remove the insulation layer that remains after the masking step. FIG. 12G shows channel stop region 48 and other channel stop regions 46 in the image sensor 112. Other channel stop regions 46 may also be p-type regions. Alternatively, if the wafer is of a p-type substrate, channel stop region 48 may be an n-type region and channel stop regions 46 may also be n-type regions.

As shown in FIG. 12H, another masking step defines at least one opening in another resist layer. Another blanket implantation process is performed on the wafer. In this process, an opposite conductivity type dopant is doped at the second implantation energy higher than the first implantation energy to form the first region having the opposite conductivity type in the second well. Additionally, this process may proceed at the second dosage. For example, a p-type dopant is heavily doped into the heavily doped p-type well 34 by this blanket implantation process. If the wafer is of a p-type substrate, an n-type dopant is heavily doped into the heavily doped n-type well. The p-type dopant may be boron. The blanket ion implantation process typically proceeds at a dosage on the order of 1E12 ions/cm² and implantation energy on the order of 300 keV. This implantation step may also form other regions in the image sensor 112, such as a pixel region. Accordingly, by using the described masking and implantation steps of FIG. 12H, both a pixel region and a temperature sensor region may be formed. This eliminates the need for performing yet another masking step and implantation step to form the temperature sensor region. Thus, processing steps to form the image sensor 112 are reduced. As shown in FIG. 12I, the resist layer is stripped by typical methods and a thermal well drive is conducted to form the first region, for example, the additional p-type implant region 195 within the heavily doped p-type well 34. Alternatively, if the wafer is of a p-type substrate, an additional n-type implant region is formed. The additional p-type implant region 195 (or additional n-type implant region) aids in reducing or eliminating substrate punch through. In one embodiment, the additional p-type implant region 195 (or additional n-type implant region) reduces or prevents substrate punch through when an electronic shutter pulse is applied to the substrate. The boundary delimiting additional p-type implant region 195 in FIG. 12I is for illustrative purposes to describe the location of the p-type implant region 195. The additional p-type implant region 195 and the heavily doped p-type well 34 are both p-type regions. A distinct boundary would not be present between two regions of the same type, such as two p-type regions or two n-type regions. In this embodiment, a gradient of dose distribution is formed along the vertical line from the surface of the wafer downward into the wafer.

As shown in FIG. 12J, another masking step defines at least two openings in another resist layer. Another blanket implantation process is performed on the wafer. In this process, a first conductivity type dopant is doped at the third dosage higher than the second dosage to form the second region having the first conductivity type in the first region and to form the fourth region having the first conductivity type in the substrate and adjacent the first well. Additionally, this process may proceed at the first implantation energy. For example, an n-plus type dopant is doped into the additional p-type implant region 195 and the n-type substrate 32 by this implantation process. If the wafer is of a p-type substrate, a p-plus type dopant is doped into the additional n-type implant region. The n-type dopant may be arsenic or phosphorus. Preferably, the n-type dopant is arsenic. The blanket ion implantation process typically proceeds at a dosage on the order of 1E15 ions/cm² and implantation energy on the order of 100 keV. As shown in FIG. 12K, the resist layer is stripped by typical methods to form the second region, for example, the n-plus implant region 36 and the fourth region, for example, the n-plus implant region 44. Alternatively, if the wafer is of a p-type substrate, a p-plus implant region for the temperature diode and a p-plus implant region to connect the substrate are formed.

As shown in FIG. 12L, another masking step defines at least one opening in another resist layer. Another blanket implantation process is performed on the wafer. In this process, an opposite conductivity type dopant is doped at the third dosage to form the third region having the opposite conductivity type in the second well and adjacent the first region. Additionally, this process may proceed at the first implantation energy. For example, a p-plus type dopant is doped into the heavily doped p-type well 34 by this implantation process. If the wafer is of a p-type substrate, an n-plus type dopant is doped into the heavily doped n-type well. The p-plus type dopant may be boron. The blanket ion implantation process typically proceeds at a dosage on the order of 1E15 ions/cm² and implantation energy on the order of 100 keV. As shown in FIG. 12M, the resist layer is stripped by typical methods to form the third region, for example, the p-plus implant region 37. Alternatively, if the wafer is of a p-type substrate, an n-plus implant region is formed.

In one embodiment as described, the implantation process steps carried out in the process of manufacturing the image sensor 112 of FIGS. 10A and 10B are not increased compared to implantation process steps carried out in a process of manufacturing the image sensor 12 of FIG. 2, even including the implantation process step carried out to form the additional p-type implant region 195 (or additional n-type implant region for a p-type substrate). In this embodiment, and as shown in FIG. 12J, the n-plus implant region 44 and the n-plus implant region 36 are formed during the same implantation process step.

As shown in FIG. 12N, known metallization processes are performed. For example, the temperature sensor for measuring temperature of the image sensor is disposed between the second region and the third region and the temperature sensor is connected to each of the second region and the third region. Specifically, the temperature sensor is the temperature diode implemented as a PN junction diode. The temperature diode 26, 27 is disposed in the heavily doped p-type well 34. The temperature diode is disposed between the p-plus implant region 37 and the n-plus implant region 36. The metallization processes also connect a metal bus line between the cathode of the temperature diode to bond pad 28 through the n-plus implant region 36. The bond pad 28 may be for a reading component. The metallization processes also connect a ground bus line between the anode of the temperature diode and ground through the p-plus implant region 37. The metallization processes also connect the n-plus implant region 44 to bond pad 42. Alternatively, if the wafer is of a p-type substrate, the same metallization processes may be performed except that a metal bus line between the anode of the temperature diode is connected to bond pad 28 through the p-plus implant region and a ground bus line between the cathode of the temperature diode 26, 27 and ground is connected through the n-plus implant region corresponding to region 37.

Other steps in the method of manufacturing the image sensor 112 not related to forming the temperature diode 26, 27 are not expressly described. Processes are carried out to form other parts of the image sensor 112, such as photodiodes to collect photons and transfer mechanism(s) to transfer photon-generated signals to an output structure to form an image. In one embodiment, the image sensor 112 is a charge-coupled device (CCD image sensor). To manufacture a CCD image sensor 112, processes are carried out to form photodiodes, vertical clock transfer registers, horizontal clock transfer registers, floating diffusions, and output amplifiers. In one embodiment, the image sensor 112 is a CMOS device. To manufacture a CMOS device 112, processes are carried out to form photodiodes, transfer gates, floating diffusions, output amplifiers, row decoders, column decoders, a sample and hold circuit, and an ADC circuit.

The cathode of the temperature diode 26, 27 is connected to the bond pad 28. As described above with respect to FIG. 3, a reading component, e.g., an analog-to-digital converter (ADC) is connected to the bond pad 28 and, as such, the reading component is connected to the cathode of the temperature diode 26, 27. The image sensor 112 includes an image sensing region (not shown) including active pixels, transfer registers, and output amplifiers, etc. (not shown).

When a negative voltage is applied at the bond pad 28, the temperature diode 26, 27 is forward-biased and current flows through the temperature diode 26, 27 from ground to the bond pad 28. The relationship between voltage $V_d$ across the temperature diode 26, 27 and current $I_d$ through the temperature diode 26, 27 is temperature dependent. In other words, at the same voltage, the current increases with the temperature. Likewise, at the same current, the absolute value of the voltage decreases with the temperature. When the relationship between $V_d$ and $I_d$ is calibrated for the image sensor 112, the temperature of the image sensor 112 is determined by reading one parameter while setting the other parameter at a constant. Temperature measurements from the temperature diode 26, 27 are read with the reading component, e.g., an analog-to-digital converter (ADC).

The invention has been described in an illustrative manner, and it is to be understood that the terminology which has been used is intended to be in the nature of words of description rather than of limitation. Many modifications and variations of the present invention are possible in light of the above teachings, and the invention may be practiced otherwise than as specifically described.

What is claimed is:

1. An image capture device comprising:
    an image sensor including an image sensing region and a temperature sensor configured to measure temperature measurements of said image sensor, wherein said image sensing region and said temperature sensor are formed in a semiconductor substrate;
    a timing generator configured to apply an electronic shutter pulse to said image sensor by applying a high voltage pulse to said semiconductor substrate;
    a reading component configured to read temperature measurements from said temperature sensor; and
    a processor configured to instruct said timing generator to apply the electronic shutter pulse to said image sensor and to disable the reading of the temperature measurements by said reading component during the application of the electronic shutter pulse.

2. The device as set forth in claim 1 further comprising a cooler configured to cool said image sensor based on the temperature measurements by said temperature sensor.

3. The device as set forth in claim 1 wherein said reading component is an analog-to-digital converter.

4. The device as set forth in claim 1 wherein said temperature sensor is a diode.

5. The device as set forth in claim 4 wherein said image sensor includes an n-type substrate and wherein said diode is disposed in a p-type well in the n-type substrate and includes an n-plus implant in said p-type well.

6. An image capture device comprising:
    an image sensor including a temperature sensor configured to measure temperature measurements of said image sensor, wherein said temperature sensor is a diode;
    a timing generator configured to apply an electronic shutter pulse to said image sensor;
    a reading component configured to read temperature measurements from said temperature sensor, wherein a cathode of said diode is connected to said reading component and an anode of said diode is connected to ground; and
    a processor configured to instruct said timing generator to apply the electronic shutter pulse to said image sensor and to disable the reading of the temperature measurements by said reading component during the application of the electronic shutter pulse.

* * * * *